US011107610B2

(12) United States Patent
Klek et al.

(10) Patent No.: US 11,107,610 B2
(45) Date of Patent: *Aug. 31, 2021

(54) THICK FILM RESISTORS HAVING CUSTOMIZABLE RESISTANCES AND METHODS OF MANUFACTURE

(71) Applicants: Raytheon Company, Waltham, MA (US); University of Massachusetts, Boston, MA (US)

(72) Inventors: Erika C. Klek, Tewksbury, MA (US); Mary K. Herndon, Littleton, MA (US); Thomas V. Sikina, Harvard, MA (US); James E. Benedict, North Chelmsford, MA (US); Andrew R. Southworth, Lowell, MA (US); Kevin M. Wilder, Derry, NH (US); Oshadha K. Ranasingha, Salem, NH (US); Alkim Akyurtlu, Arlington, MA (US)

(73) Assignees: Raytheon Company, Waltham, MA (US); University of Massachusetts, Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/901,429

(22) Filed: Jun. 15, 2020

(65) Prior Publication Data

US 2020/0365300 A1    Nov. 19, 2020

Related U.S. Application Data

(63) Continuation of application No. 16/415,570, filed on May 17, 2019, now Pat. No. 10,839,992.

(51) Int. Cl.
*H01C 7/00* (2006.01)
*H01B 3/10* (2006.01)
*H01C 17/065* (2006.01)

(52) U.S. Cl.
CPC ........... *H01C 7/003* (2013.01); *H01B 3/10* (2013.01); *H01C 17/06533* (2013.01)

(58) Field of Classification Search
CPC ..... H01C 7/033; H01C 17/06533; H01B 3/10
See application file for complete search history.

(56) References Cited

U.S. PATENT DOCUMENTS

| 2,795,680 A | 6/1957 | Peck |
| 4,782,202 A | 11/1988 | Sawae et al. |

(Continued)

FOREIGN PATENT DOCUMENTS

| DE | 10 2011 007138 A1 | 6/2012 |
| EP | 0357443 A2 | 3/1990 |
| JP | S62 92864 A | 4/1987 |

OTHER PUBLICATIONS

International Search Report dated Aug. 9, 2020 in connection with counterpart International Patent Application No. PCT/US2020/026714, 4 pages.

(Continued)

*Primary Examiner* — Kyung S Lee (57) ABSTRACT

A method includes blending a dielectric material including a titanate with a carbon-based ink to form a modified carbon-based ink. The method also includes printing the modified carbon-based ink onto a structure. The method further includes curing the printed modified carbon-based ink on the structure at a temperature that does not exceed about 250° C. In addition, the method includes processing the cured printed modified carbon-based ink to form a thick film resistor. Blending the dielectric material with the carbon-based ink causes the modified carbon-based ink to have a resistivity that is at least double a resistivity of the carbon-based ink.

20 Claims, 3 Drawing Sheets

(56) References Cited

U.S. PATENT DOCUMENTS

| | | | |
|---|---|---|---|
| 5,065,068 A | 11/1991 | Oakley | |
| 5,439,768 A | 8/1995 | Matsuo et al. | |
| 5,714,096 A * | 2/1998 | Dorfman | H01C 7/027 |
| | | | 252/511 |
| 5,731,116 A | 3/1998 | Matsuo et al. | |
| 6,525,144 B1 | 2/2003 | Tanahashi et al. | |
| 7,015,256 B2 | 3/2006 | Ito et al. | |
| 7,585,474 B2 | 9/2009 | Wong et al. | |
| 7,955,266 B2 | 6/2011 | Casula et al. | |
| 8,890,543 B2 | 11/2014 | Steeneken et al. | |
| 9,058,912 B2 | 6/2015 | Hara et al. | |
| 9,487,445 B2 | 11/2016 | Natsui et al. | |
| 9,673,379 B2 | 6/2017 | Murakami et al. | |
| 9,809,720 B2 | 11/2017 | Haghzadeh et al. | |
| 9,984,785 B2 | 5/2018 | Roberson et al. | |
| 2002/0132898 A1 | 9/2002 | Takaya et al. | |
| 2002/0193236 A1 | 12/2002 | Takaya et al. | |
| 2002/0193462 A1 | 12/2002 | Angeletakis et al. | |
| 2002/0197461 A1 | 12/2002 | Takaya et al. | |
| 2004/0022000 A1 | 2/2004 | Schmitz | |
| 2004/0051795 A1 | 3/2004 | Ajioka | |
| 2004/0227705 A1 | 11/2004 | Fujimoto et al. | |
| 2004/0262210 A1 | 12/2004 | Westervelt et al. | |
| 2005/0019592 A1 | 1/2005 | Bai et al. | |
| 2005/0101714 A1 | 5/2005 | Yamasaki et al. | |
| 2005/0130446 A1 | 6/2005 | Takaya et al. | |
| 2005/0130447 A1 | 6/2005 | Takaya et al. | |
| 2005/0154110 A1 | 7/2005 | Takaya et al. | |
| 2006/0046320 A1 | 3/2006 | Sunahara et al. | |
| 2006/0074164 A1 | 4/2006 | Slenes et al. | |
| 2006/0102487 A1 | 5/2006 | Parsons, II et al. | |
| 2006/0120020 A1 | 6/2006 | Dowgiallo, Jr. et al. | |
| 2006/0159927 A1 | 7/2006 | Hara et al. | |
| 2006/0186382 A1 | 8/2006 | Igarashi et al. | |
| 2006/0237717 A1 | 10/2006 | Bai et al. | |
| 2007/0039814 A1 | 2/2007 | Maggard | |
| 2007/0087929 A1 | 4/2007 | Park et al. | |
| 2007/0149668 A1 | 6/2007 | Satou et al. | |
| 2007/0279182 A1 | 12/2007 | Kodas et al. | |
| 2007/0292613 A1 | 12/2007 | Mariani et al. | |
| 2008/0020231 A1 | 1/2008 | Yamada et al. | |
| 2008/0025593 A1 | 1/2008 | Ajioka | |
| 2008/0060743 A1 | 3/2008 | Minamikawa et al. | |
| 2008/0280748 A1 | 11/2008 | Nishigaki et al. | |
| 2009/0022999 A1 | 1/2009 | Wuu | |
| 2009/0066433 A1 | 3/2009 | Yamamoto | |
| 2009/0134361 A1 * | 5/2009 | Takashima | H01C 17/006 |
| | | | 252/503 |
| 2010/0027192 A1 * | 2/2010 | Perry | C01G 1/02 |
| | | | 361/323 |
| 2010/0051917 A1 | 3/2010 | Kippelen et al. | |
| 2010/0144947 A1 | 6/2010 | Narishige et al. | |
| 2010/0246010 A1 | 9/2010 | Mitamura | |
| 2011/0048772 A1 * | 3/2011 | Han | C09D 11/52 |
| | | | 174/257 |
| 2011/0221302 A1 | 9/2011 | Yabuta et al. | |
| 2012/0111599 A1 * | 5/2012 | Roberson | B82Y 30/00 |
| | | | 174/107 |
| 2012/0212317 A1 * | 8/2012 | Bulmer | H01C 17/242 |
| | | | 338/214 |
| 2013/0021764 A1 | 1/2013 | Yeo et al. | |
| 2013/0152683 A1 | 6/2013 | Noh et al. | |
| 2014/0178290 A1 | 6/2014 | Yabuta et al. | |
| 2014/0239738 A1 | 8/2014 | Koyama et al. | |
| 2015/0140296 A1 | 5/2015 | Matsushima et al. | |
| 2015/0162104 A1 | 6/2015 | Soininen | |
| 2015/0183992 A1 * | 7/2015 | Zeng | B32B 15/14 |
| | | | 428/416 |
| 2015/0189745 A1 | 7/2015 | Zeng et al. | |
| 2015/0189747 A1 | 7/2015 | Zeng et al. | |
| 2015/0240055 A1 | 8/2015 | Zeng et al. | |
| 2015/0263325 A1 | 9/2015 | Honda et al. | |
| 2015/0349239 A1 | 12/2015 | Murakami et al. | |
| 2017/0009090 A1 | 1/2017 | Haghzadeh et al. | |
| 2017/0092556 A1 | 3/2017 | Gustafson | |
| 2017/0129816 A1 | 5/2017 | Deville et al. | |
| 2017/0174915 A1 | 6/2017 | Rolin et al. | |
| 2017/0253751 A1 | 9/2017 | Busbee et al. | |
| 2018/0072901 A1 | 3/2018 | Haghzadeh et al. | |
| 2020/0148905 A1 | 5/2020 | Ranasingha et al. | |

OTHER PUBLICATIONS

Written Opinion of the International Searching Authority dated Aug. 9, 2020 in connection with counterpart International Patent Application No. PCT/US2020/026714, 8 pages.
DuPont, "DuPont 00X0A, Resistor Series", 2018, 3 pages.
DuPont, "DuPont 110X, High Voltage Thick Film Resistor Composition", May 2013, 4 pages.
DuPont, "DuPont Series 17 Resistors, High Reliability Hybrid Microcircuits and Precision Resistor Network 10Ω—1MΩ/SQ Silver Alloy Terminations", Oct. 2013, 15 pages.
DuPont, "DuPont Microcircuit Materials, Thick Film Composition", Mar. 2009, 20 pages.
DuPont, "DuPont 4300 Series Resistors, 1Ω/sq—1MΩ/sq Resistors for Cermet Trimmers and Potentiometers", May 2013, 3 pages.
DuPont, "DuPont 5091D/5092D/5093D, PTC Thermistor Composition", Dec. 2012, 2 pages.
CreativeMaterials, "Carbon Inks", 2018, 2 pages.
Jeschke et al., "In-Situ Blending of Inkjet-Printed Thick-Film Resistors", IMAPS/ACerS 9th CICMT Conference (2013), Apr. 2013, 10 pages.
DuPont, "DuPont QS87 Series Resistors, Series Q-Q SIL", Oct. 2013, 12 pages.
DuPont, "S1X0 Series Resistors, 10 Ω/sq—1 MΩ/sq Resistor Compositions", May 2008, 6 pages.
Bhore, "Formulation and Evaluation of Resistive Inks for Applications in Printed Electronics", Master's Theses, Western Michigan University, Dec. 2013, 94 pages.
DuPont, "Thick Film Resistor Materials for Hybrid Applications", 2018, 2 pages.
Oshadha Ranasingha LinkedIn profile, www.linkedin.com/in/oshadharanasingha, retrieved online Feb. 27, 2019, 4 pages.
DuPont, "DuPont PE827, Ultra-Low Temperature Cure Silver Composite Conductor", Sep. 2015, 2 pages.

* cited by examiner

THICK FILM RESISTORS HAVING CUSTOMIZABLE RESISTANCES AND METHODS OF MANUFACTURE

CROSS-REFERENCE TO RELATED APPLICATION AND PRIORITY CLAIM

This application claims priority under 35 U.S.C. § 120 as a continuation of U.S. patent application Ser. No. 16/415,570 filed on May 17, 2019 (now U.S. Pat. No. 10,811,173), which is hereby incorporated by reference in its entirety.

TECHNICAL FIELD

This disclosure relates generally to resistors and techniques for manufacturing resistors. More specifically, this disclosure relates to thick film resistors having customizable resistances and methods of manufacture.

BACKGROUND

Resistors are used in various ways in numerous electronic devices and other devices, and different types of resistors have been developed over the years. A "surface mount" resistor generally represents a resistor having electrical terminals that are mounted on the surface of a printed circuit board or other substrate. A "thin film" resistor generally represents a resistor formed by depositing a thin layer of resistive material onto a ceramic base or other substrate. A "thick film" resistor generally represents a resistor formed by depositing a thick paste of resistive material onto a printed circuit board or other substrate.

Surface mount resistors are typically not low-profile or low-cost devices, and the use of surface mount resistors can lead to the creation of parasitic capacitances and parasitic inductances in circuits or devices. Thick film resistors often would be more suitable for use in higher-current or higher-power applications than thin film resistors. Unfortunately, thick film resistors can have difficulty adhering to certain types of substrates. Also, thick film resistors can still have limited current- and power-handling capabilities, which may prevent their use in certain higher-current or higher-power applications. Further, it is often more difficult to control the geometries (and therefore the resistances) of thick film resistors compared to thin film resistors. Thick film material used to form thick film resistors typically has high viscosity and high shrinkage after curing, which make geometry control difficult. In addition, manufacturing techniques for thick film resistors often involve sintering or other high-temperature operations, which can often involve temperatures of up to 500° C., 700° C., 850° C., or even more. These temperatures can damage other electrical components, preventing the use of these manufacturing techniques for various applications.

SUMMARY

This disclosure provides thick film resistors having customizable resistances and methods of manufacture.

In a first embodiment, a method includes blending a dielectric material including a titanate with a carbon-based ink to form a modified carbon-based ink. The method also includes printing the modified carbon-based ink onto a structure. The method further includes curing the printed modified carbon-based ink on the structure at a temperature that does not exceed about 250° C. In addition, the method includes processing the cured printed modified carbon-based ink to form a thick film resistor. Blending the dielectric material with the carbon-based ink causes the modified carbon-based ink to have a resistivity that is at least double a resistivity of the carbon-based ink.

In a second embodiment, a method includes obtaining a modified carbon-based thick film material that includes a carbon-based thick film material blended with a dielectric material. The method also includes depositing the modified carbon-based thick film material onto a structure. The method further includes curing the deposited modified carbon-based thick film material on the structure at a temperature that does not exceed about 250° C. In addition, the method includes processing the cured deposited modified carbon-based thick film material to form a thick film resistor. The dielectric material blended with the carbon-based thick film material causes the modified carbon-based thick film material to have a resistivity that is at least double a resistivity of the carbon-based thick film material.

In a third embodiment, an apparatus includes a thick film resistor fabricated by (i) printing a modified carbon-based ink onto a structure, where the modified carbon-based ink includes a dielectric material including a titanate blended with a carbon-based ink; (ii) curing the printed modified carbon-based ink on the structure at a temperature that does not exceed about 250° C.; and (iii) processing the cured printed modified carbon-based ink to form the thick film resistor. The dielectric material blended with the carbon-based ink causes the modified carbon-based ink to have a resistivity that is at least double a resistivity of the carbon-based ink.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1A through 3, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, thick film resistors would often be more desirable or more suitable for use than thin film resistors and surface mount resistors, but thick film resistors can suffer from a number of disadvantages. For instance, thick film resistors can have difficulty adhering to certain types of substrates, such as those formed from polytetrafluoroethylene (PTFE) or other types of substrates, and may have limited current- and power-handling capabilities. Also, thick film material that is used to form thick film resistors typically has high viscosity and high shrinkage after curing, which makes geometry control (and therefore resistance control) of the thick film resistors difficult. In addition, manufacturing techniques for thick film resistors often involve the performance of sintering or other high-temperature operations, which can damage other components.

This disclosure describes various techniques for printing or otherwise forming thick film resistors having customizable resistances. As described in more detail below, a carbon-based ink, paste, or other thick film material can be modified by adding dielectric material (generally referred to as a "modifier") to the thick film material in order to produce a modified thick film material. Example types of dielectric material include at least one titanate, such as barium titanate (BT), strontium titanate (ST), or barium strontium titanate (BST). The amount of modifier added to the carbon-based thick film material may be based on the desired resistance of the modified thick film material. The modified thick film material can then be printed or otherwise deposited onto printed circuit boards or other substrates or structures, cured, and processed to form thick film resistors.

The amount of modifier added to the carbon-based thick film material alters the resistance that can be obtained using the thick film material. This allows the resistances of the thick film resistors formed using the thick film material to be controlled or customized as needed. However, the amount of modifier added to the carbon-based thick film material can be relatively small (such as up to about 15% by weight). This allows the carbon-based thick film material to retain adequate conductive carbon particles to achieve substantial current- and power-handling capabilities while also achieving significantly higher resistances (compared to the resistance of the thick film material itself).

In this way, thick film resistors can be manufactured having lower physical profiles and less parasitic capacitances and inductances than surface mount resistors while being able to handle higher currents or powers than thin film resistors. Moreover, because the surface energy of the modified thick film material is relatively low, the thick film material can adhere well to many substrates (including PTFE substrates). Further, these approaches allow for improved control of both the geometry and the resistivity of the thick film material. For instance, the viscosity of the uncured modified thick film material can be lower compared to typical thick film material, which allows for improved control in the deposition of the modified thick film material at higher thicknesses. In addition, thick film resistors can be cured at significantly lower temperatures (such as less than 250° C.) while achieving repeatable, stable performance. Overall, this allows thick film resistors to be fabricated having at least one desired geometry while allowing their resistances to be tailored as needed, which can occur using a variety of substrate types and customizable sheet resistivity in a manner that survives lamination temperatures while at the same time not requiring the high-temperature curing of typical resistive inks (often in excess of 500° C.).

Figure 1A:
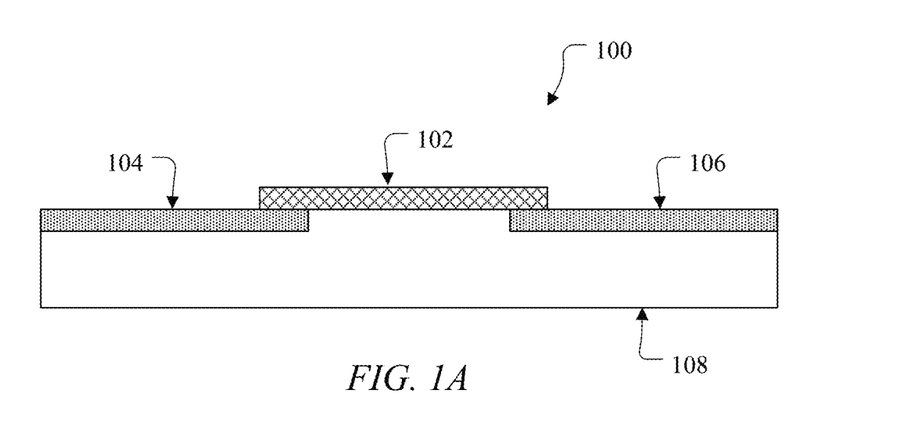
FIGS. 1A and 1B illustrate an example circuit having a thick film resistor with a customizable resistance according to this disclosure.
Figure 1B:
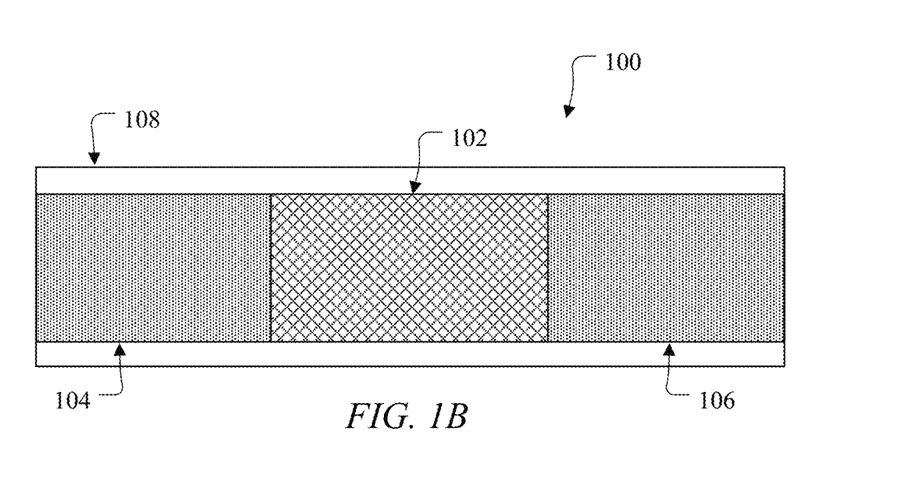

FIGS. 1A and 1B illustrate an example circuit 100 having a thick film resistor 102 with a customizable resistance according to this disclosure. In particular, FIG. 1A illustrates a cross-sectional view of a portion of the circuit 100 with the thick film resistor 102, and FIG. 1B illustrates a top view of the portion of the circuit 100 with the thick film resistor 102.

As shown in FIGS. 1A and 1B, the circuit 100 uses the thick film resistor 102 to electrically couple two conductive traces 104 and 106 together, where the thick film resistor 102 and the conductive traces 104 and 106 are positioned over a substrate 108. The conductive traces 104 and 106 represent any suitable conductive pathways through which an electrical signal can flow to and from the thick film resistor 102. The conductive traces 104 and 106 may be formed from any suitable material. For example, the conductive traces 104 and 106 may represent copper traces or other electrical traces formed using one or more conductive metals or other material. Also, the conductive traces 104 and 106 may be formed in any suitable manner, such as by depositing and etching the conductive material. In addition, each of the conductive traces 104 and 106 may have any suitable size, shape, and dimensions. Note that the relative positions of the thick film resistor 102 and the conductive traces 104 and 106 in FIGS. 1A and 1B are for illustration only and can vary as needed or desired. For instance, the conductive traces 104 and 106 may be formed over the thick film resistor 102.

The substrate 108 represents any suitable structure in or on which electrical components and electrical pathways can be formed. For example, the substrate 108 may represent a rigid printed circuit board, a flexible circuit board, or any other suitable base or structure used to carry electrical components and conductive traces or other conductive pathways coupling the electrical components. The substrate 108 may be formed from any suitable material, such as cotton paper, woven fiberglass, or woven glass and epoxy resin, carbon, metal, alumina or other ceramic, or PTFE, polyimide, polyester, or other polymer. Also, the substrate 108 may be formed in any suitable manner, such as by using a single layer of material or by using multiple layers of material that are laminated or otherwise joined together. In addition, the substrate 108 may have any suitable size, shape, and dimensions.

The thick film resistor 102 is formed by depositing a thick film material over the substrate 108 (and over the conductive traces 104 and 106 in this example). Once deposited, the thick film material is cured and can then be further processed as needed to form the thick film resistor 102. In some embodiments, the thick film material can be deposited via printing, such as by using a three-dimensional (3D) printer or other deposition system in an additive manufacturing process. Depending on the other components of a circuit or device, this may allow the entire circuit or device to be formed using an additive manufacturing process. Note, however, that any other suitable techniques may be used to deposit a thick film material to form the thick film resistor 102, such as screen printing, spraying, dipping, or coating.

As described in more detail below, the thick film material used to form the thick film resistor 102 is a carbon-based thick film material, such as a carbon-based ink, that has been mixed with or has otherwise incorporated dielectric material (generally referred to as a "modifier"). Any suitable type of carbon-based ink or other thick film material may be used to form the thick film resistor 102, such as a carbon-based ink (like the C-200 carbon resistive ink from APPLIED INK SOLUTIONS). Also, any suitable dielectric material can be used as the modifier and incorporated into the carbon-based thick film material, such as a titanate. Example titanates include barium titanate (BT), strontium titanate (ST), and barium strontium titanate (BST).

The dielectric material incorporated into the carbon-based thick film material alters the resistance of the modified thick film material, and the change in resistance can be based on the amount of the dielectric material incorporated into the thick film material. This allows customization of the resistance of the thick film resistor 102 based on the amount of the dielectric material incorporated into the carbon-based thick film material. In some embodiments, the amount of dielectric material incorporated into a carbon-based thick film material can be relatively small and yet still have a large impact on the overall resistances that can be obtained using the modified carbon-based thick film material. In particular embodiments, for instance, a modified carbon-based ink or other modified thick film material may contain up to about 15% (by weight) of the dielectric material, and different percentages by weight of the dielectric material can be used to obtain different resistances of the modified thick film material.

In this particular example, the thick film resistor 102 is shown as being generally rectangular in shape (when viewed from on top or on bottom). However, modified thick film material can be printed or otherwise deposited in a wide range of geometries, allowing the thick film resistor 102 to be formed having any suitable size and shape for a specific application. Also, the modified thick film material can be printed or otherwise deposited in planar or non-planar geometries. Example types of non-planar geometries may include pyramidal, cylindrical, or rectangular prisms, as well as generally two-dimensional patterns deposited on curved or other non-planar substrates. By allowing both the customization of the resistance of the modified thick film material and the customization of the geometry in which the modified thick film material is deposited, this approach provides a highly-tunable solution that allows thick film resistors to be fabricated with a wide range of resistances and geometries for various applications.

Moreover, thick film resistors can be fabricated to achieve high sheet resistances without negatively impacting the current- and power-handling capabilities of the thick film resistors. This may occur since the bulk of the thick film resistor 102 is formed by the conductive carbon or other conductive material in a carbon-based ink or other thick film material (since the thick film material may include a relatively small amount of dielectric material). This allows the use of the thick film resistor 102 in higher-current or higher-power applications, such as applications involving up to about 200 mA of current and/or up to about 0.5 W or about 1.0 W of power, without fusing.

The modified thick film material allows for fabrication of thick film resistors using dry manufacturing processes. Of course, any other suitable manufacturing processes may use the modified thick film material to form thick film resistors. Also, note that one or more thick film resistors 102 can be formed on various types of substrates (including PTFE-based substrates), and each thick film resistor 102 can have smaller parasitic capacitance and inductance effects compared to surface mount resistors. Further note that the thick film resistor 102 can be stable at room temperatures and stable at high temperatures (depending on the substrate 108). This means that the resistance of the thick film resistor 102 can remain substantially constant over time at room temperatures and possibly at higher temperatures.

Once the modified thick film material is deposited and cured (which can occur at relatively low temperatures as described below), additional operations may be performed to adjust the resistance of the thick film resistor 102 or to otherwise complete the fabrication of the thick film resistor 102. For example, trimming operations may be performed to alter the shape and therefore the resistance of the thick film resistor 102. Also, additional layers of material may be deposited over the thick film resistor 102 and the conductive traces 104 and 106, such as to protect these components or to form other electrical components or electrical pathways over the thick film resistor 102 and the conductive traces 104 and 106.

In some embodiments, the thick film resistor 102 can be fabricated to have standard dimensions established by a standards body or by industry practice. As a particular example, the thick film resistor 102 may be fabricated to have dimensions defined by standard surface mount device (SMD) resistor sizes. Here, for instance, a "0402" resistor size may refer to a resistor that is about 0.04 inches or 1.0 millimeters in length, about 0.02 inches or 0.5 millimeters in width, and about 0.014 inches or 0.35 millimeters in height. A "0805" resistor size may refer to a resistor that is about 0.08 inches or 2.0 millimeters in length, about 0.05 inches or 1.2 millimeters in width, and about 0.018 inches or 0.45 millimeters in height. Of course, thick film resistors 102 may be fabricated to have any other suitable standard or non-standard sizes and shapes.

Although FIGS. 1A and 1B illustrate one example of a circuit 100 having a thick film resistor 102 with a customizable resistance, various changes may be made to FIGS. 1A and 1B. For example, the thick film resistor 102 may have any other suitable size, shape, and dimensions. Also, the thick film resistor 102 may be used in any other suitable manner. In addition, a circuit 100 may include any suitable number of thick film resistors 102 in any suitable positions or arrangements, and different thick film resistors 102 in the circuit 100 may or may not have different sizes, shapes, or dimensions.

Figure 2:
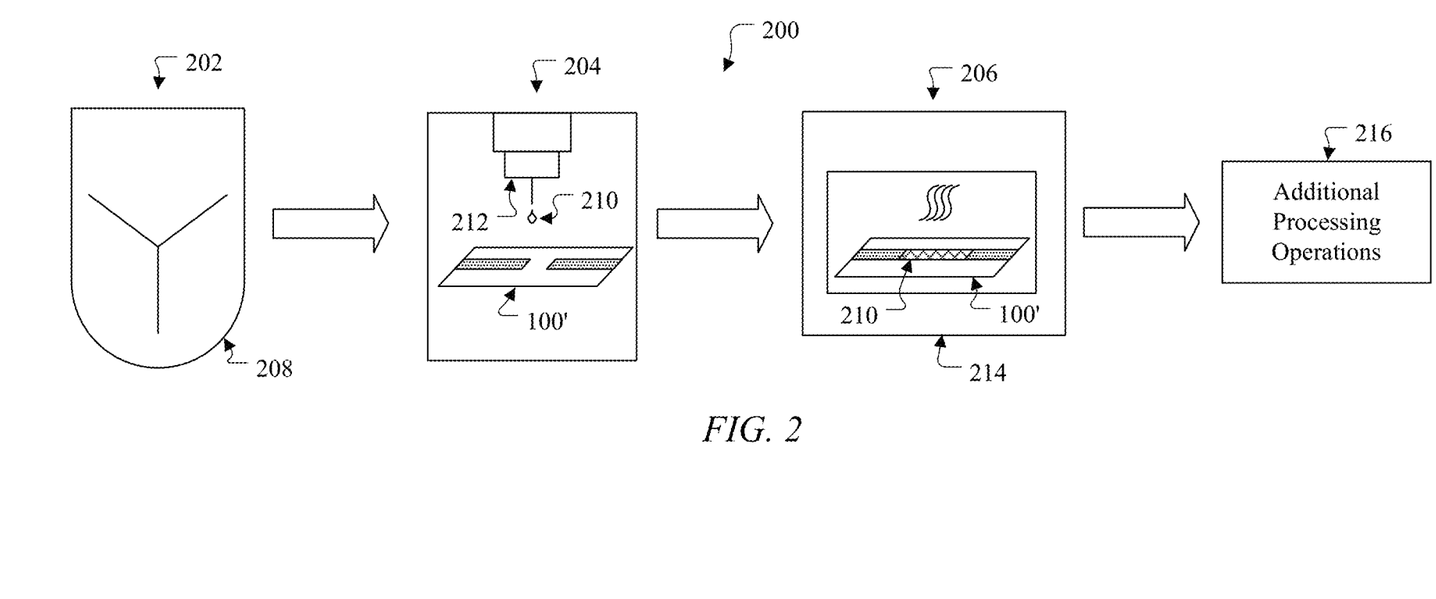
FIG. 2 illustrates an example operational flow for forming thick film resistors having customizable resistances according to this disclosure.

FIG. 2 illustrates an example operational flow 200 for forming thick film resistors having customizable resistances according to this disclosure. For ease of explanation, the operational flow 200 shown in FIG. 2 is described as being used to manufacture the thick film resistor 102 of the example circuit 100 shown in FIG. 1. However, the operational flow 200 shown in FIG. 2 may be used to manufacture any suitable thick film resistor or resistors in any suitable circuit, device, or system.

As shown in FIG. 2, the operational flow 200 includes a mixing operation 202, a deposition operation 204, and a curing operation 206. In the mixing operation 202, a mixer 208 generally operates to mix a carbon-based ink or other carbon-based thick film material with a titanate or other dielectric material. This helps to ensure that a modified carbon-based thick film material (such as a modified carbon-based ink or paste) has a substantially even distribution of titanate or other dielectric material within the conductive material of the thick film material. The mixer 208 represents any suitable structure configured to mix carbon-based thick film material and dielectric material, such as a centrifugal mixer.

During the mixing operation 202, the amount of dielectric material added to the carbon-based ink or other carbon-based thick film material can vary based on the desired resistance of one or more thick film resistors 102 to be fabricated. As noted above, the amount of dielectric material added to the carbon-based thick film material can be limited to a relatively low amount, such as no more than about 15% of the total weight of the combined conductive and dielectric materials. Even using relatively small amounts of dielectric material such as titanates in carbon-based inks or other carbon-based thick film material can greatly increase the resistance of the carbon-based thick film material. For example, adding about 5% by weight of barium strontium titanate to a carbon-based ink (such as C-200 carbon resistive ink) may increase the resistance of the carbon-based ink by more than 260%. Thus, small amounts of titanate or other dielectric material can quickly increase the resistance of the modified carbon-based thick film material, which allows a fusing current of the manufactured thick film resistor 102 to remain high even with the presence of the dielectric material in the modified thick film material. In particular embodiments, the dielectric material may at least double the resistivity of the carbon-based thick film material.

In the deposition operation 204, a modified thick film material 210 (which is produced by the mixing operation 202) is deposited onto a substrate or other structure. In this example, a printer 212 deposits the modified thick film material 210 onto a structure 100', which represents the circuit 100 of FIGS. 1A and 1B without the thick film resistor 102. Of course, the printer 212 may deposit the modified thick film material 210 onto any other suitable circuit or other structure. The printer 212 represents any suitable structure configured to print thick film material 210 onto one or more structures in order to form one or more thick film resistors 102, such as a 3D printer. As a particular example, the deposition operation 204 may be implemented using a high-precision dispensing system from NORDSON CORP. Note, however, that the deposition operation 204 may use any other suitable equipment to deposit the thick film material 210, such as screen printing or spraying equipment.

When depositing the modified thick film material 210 onto a structure, the thick film material 210 can be deposited in any suitable manner. In some embodiments, for example, the thick film material 210 can be deposited by the printer 212 or other device using an "S" pattern fill from a center of the thick film resistor 102 being formed, where a width of the pattern depends on the size of the thick film resistor 102 being formed. This type of deposition pattern may help to reduce or prevent the formation of a large lip at a beginning edge of the deposited thick film material 210. Note, however, that the modified thick film material 210 can be deposited in any other suitable manner.

In the curing operation 206, the modified thick film material 210 that has been deposited onto the structure 100' is cured. In this example, a heater 214 is used during the curing operation 206 to heat the structure 100' and the thick film material 210 on the structure 100' in order to cure the thick film material 210. The temperature of the curing operation 206 and the time needed for the curing operation 206 can vary based on a number of factors, such as the composition of the modified thick film material 210 and the shape or thickness of the deposited thick film material 210. In general, the temperature of the curing operation 206 may be about 250° C. or lower or about 200° C. or lower. As a specific example, the curing operation 206 may involve heating the structure 100' and the thick film material 210 to a temperature of about 70° C. for about five hours or to a temperature of about 160° C. for about thirty minutes. The ability to cure the modified thick film material 210 at relatively low temperatures enables the use of various plastic substrates 108 or other components or materials in the structure 100' that cannot withstand the elevated temperatures used in standard sintering operations or other high-temperature operations (which can often involve temperatures of 500° C., 700° C., 850° C., or even more). Thus, the operational flow 200 enables the manufacture of thick film resistors 102 having high sheet resistances without requiring high-temperature sintering operations.

Ideally, the dielectric material added to the carbon-based ink or other carbon-based thick film material during the mixing operation 202 to produce the modified thick film material 210 is heat-stable. For example, titanates such as barium strontium titanate are heat-stable compounds, meaning the compounds do not decompose into their constituent elements (at least within the temperature range experienced by the modified thick film material 210 during manufacture and use of the thick film resistor 102). Assuming a base (unmodified) carbon-based ink or other carbon-based thick film material is heat-stable itself, the modified thick film material 210 has a higher resistance and is also heat-stable. The heater 214 represents any suitable structure configured to increase the temperature of a deposited thick film material 210 in order to cure the thick film material 210. For instance, in a larger manufacturing setting or other setting, the heater 214 may represent a large oven. In a smaller setting, the heater 214 may represent a smaller oven or even a device such as a hot plate.

Once the curing operation 206 is completed, any additional processing operations 216 may be performed to complete the fabrication of the thick film resistor 102 (if needed) or to complete the fabrication of a circuit, device, or system that includes the thick film resistor 102. For example, the thick film resistor 102 may be etched to have a desired shape or final resistance value. In some embodiments, for instance, the thick film resistor 102 can be placed into a fluoro-etch bath at about 60° C. for about thirty seconds up to several minutes. The thick film resistor 102 or other components can also be cleaned, such as by using isopropyl alcohol or methanol. In addition, some amount of power (such as about 0.25 W to about 0.5 W) can be applied across the thick film resistor 102 once fabrication is completed to help prevent subsequent changes to the resistance of the thick film resistor 102.

At some point during the operational flow 200 in FIG. 2, one or more steps may need to be taken to reduce or prevent oxidation of the exposed surfaces of the conductive traces 104 and 106. For example, when copper traces are used as the conductive traces 104 and 106 in the circuit 100, copper oxide may form on the exposed surfaces of the conductive traces 104 and 106. Copper oxide can form at relatively low temperatures, and the presence of copper oxide on the conductive traces 104 and 106 can lead to the formation of an electrically-insulative interface between the conductive traces 104 and 106 and the thick film resistor 102 to be formed. Various techniques may be used here to reduce or prevent the formation of oxides or other insulative material on the conductive traces 104 and 106. As examples, electroless nickel/immersion gold (ENIG) surface plating can be used on the conductive traces 104 and 106, or an encapsulant/epoxy/sealant can be placed on the conductive traces 104 and 106 to prevent oxygen absorption. As another example, a graphene-based ink can be mixed with the dielectric material to form the modified thick film material 210 since graphene is essentially a two-dimensional arrangement of carbon atoms and can reduce or prevent oxide growth. As yet another example, sodium borohydride can be added to the modified thick film material 210 to reduce or prevent the formation of oxide. As still another example, the thick film resistor 102 can be cured or baked in a vacuum oven or other oxygen-free environment. It should be noted that curing/baking typically causes a small but predictable change in the resistance of the thick film resistor 102, which can be taken into account when fabricating the thick film resistor 102. Of course, any other suitable material selections or techniques may be used to inhibit or avoid the formation of oxide on the conductive traces 104 and 106.

Thick film resistors 102 manufactured in this manner can have various advantages over standard thick film resistors. For example, by allowing titanate or other dielectric material to be mixed with a thick film material, the resistance or conductivity of the modified thick film material 210 can be precisely controlled prior to deposition. Also, the modified thick film material 210 can have a more uniform composition, enabling more consistent fabrication of thick film resistors 102. Further, by reducing or minimizing the amount of titanate or other dielectric material in the modified thick film material 210, higher sheet resistances can be obtained while maintaining high fusing currents in the thick film resistors 102 and while maintaining high stability of the thick film resistors 102 over temperature. As noted above, for instance, in some embodiments, thick film resistors 102 may handle up to about 200 mA of current and/or up to about 0.5 W or about 1.0 W of power without fusing. In addition, in some embodiments, the thick film resistors 102 may have reduced or minimal porosity compared to other thick film resistors. This can help to provide improved or maximum stability of the thick film resistors 102 under changing conditions (such as changing humidity or thermal conditions). Finally, the thick film resistors 102 may have resistances that are substantially stable at room temperatures, meaning the resistances of the thick film resistors 102 remain substantially constant over time at room temperatures.

The operational flow 200 shown in FIG. 2 may be useful in a number of circumstances. For example, the operational flow 200 may be used in large manufacturing settings to manufacture thick film resistors 102 in various circuits, devices, or systems. As a particular example, the operational flow 200 may be used to support large additive manufacturing processes in which 3D printers or other devices fabricate thick film resistors 102 of various configurations in various structures. As another example, the operational flow 200 may be used in research and development facilities, laboratories, or other locations to fabricate numerous prototypes or test devices that incorporate thick film resistors 102. The modifiable resistances and flexible geometries of the thick film resistors 102 enable the thick film resistors 102 to be incorporated quickly into many different designs.

Although FIG. 2 illustrates one example of an operational flow 200 for forming thick film resistors 102 having customizable resistances, various changes may be made to FIG. 2. For example, the specific equipment shown as being used in the mixing, deposition, and curing operations 202, 204, and 206 are examples only. Any suitable equipment can be used to perform each of the operations 202, 204, and 206. Also, the various additional operations 216 can be performed as needed or desired in order to fabricate thick film resistors 102, and the additional operations 216 can vary based (among other things) on the materials being used to fabricate the thick film resistors 102 and/or the materials in the structure 100' on which the thick film resistors 102 are being formed.

Figure 3:
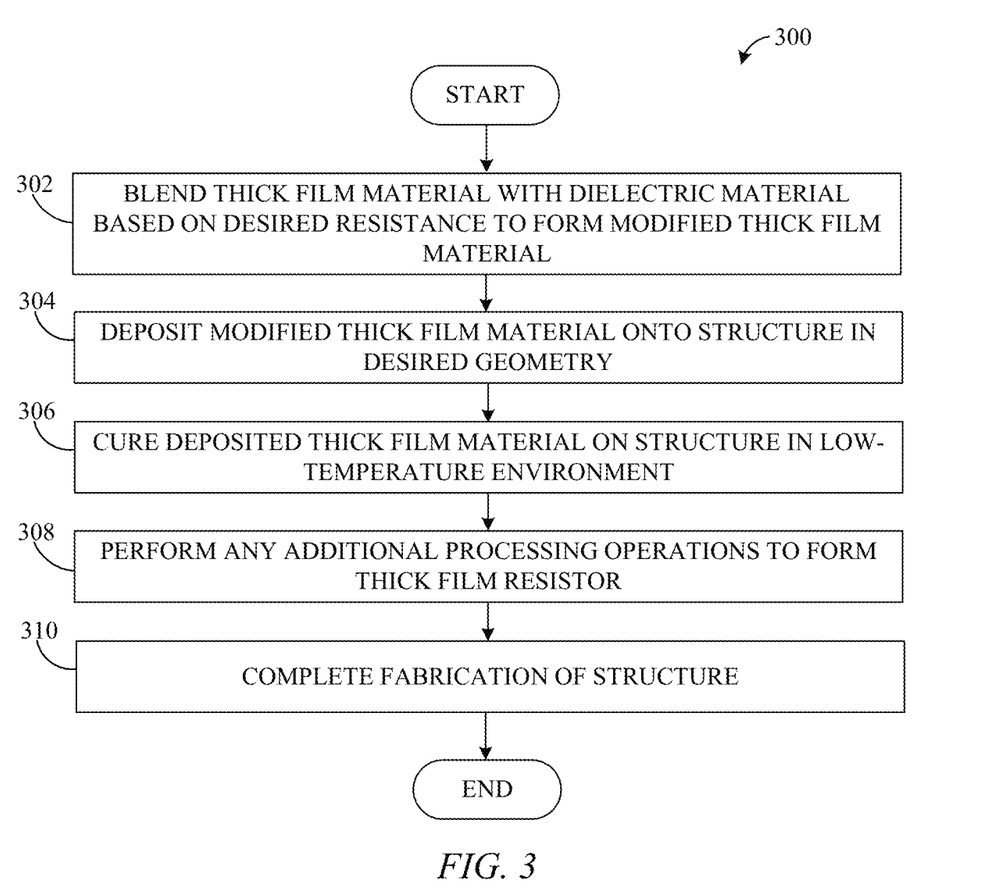
FIG. 3 illustrates an example method for forming a thick film resistor having a customizable resistance according to this disclosure.

FIG. 3 illustrates an example method 300 for forming a thick film resistor having a customizable resistance according to this disclosure. For ease of explanation, the method 300 shown in FIG. 3 is described as being used to manufacture the thick film resistor 102 of the example circuit 100 shown in FIG. 1 using the equipment included in the operational flow 200 shown in FIG. 2. However, the method 300 shown in FIG. 3 may be used to form any suitable thick film resistors in any suitable circuits, devices, or systems and may involve the use of any suitable equipment for various operations.

As shown in FIG. 3, a thick film material is blended with a dielectric material to form a modified thick film material at step 302. This may include, for example, blending a carbon-based ink or other carbon-based thick film material with barium titanate, strontium titanate, barium strontium titanate, or other dielectric material. The blending can occur using a mixer 208 that is designed to help ensure an adequate distribution of the dielectric material within the carbon-based conductive material. The amount of dielectric material added to the carbon-based ink or other carbon-based thick film material can be based on the desired resistance of the modified thick film material 210 being produced. In some embodiments, for example, the amount of dielectric material added to the carbon-based ink or other carbon-based thick film material may be limited to a maximum of about 5% to about 15% by weight of the modified thick film material 210.

The modified thick film material is deposited onto a structure in a desired geometry at step 304. This may include, for example, depositing the modified carbon-based thick film material onto conductive traces 104 and 106 of a structure 100' using a printer 212 or other deposition system. As noted above, the geometry of the thick film resistor 102 being fabricated can vary as needed, such as based on the desired application and the available space for the thick film resistor 102 being fabricated. Note that while the modified thick film material 210 is described here as being deposited in a geometry during the fabrication of a thick film resistor 102, this step may involve the deposition of the modified thick film material in multiple areas (using the same geometry or different geometries) during the fabrication of multiple thick film resistors 102. Also note that this step may occur repeatedly for the same thick film resistor 102 if the modified thick film material 210 is being deposited in multiple layers to form the thick film resistor 102.

The deposited thick film material is cured on the structure in a (relatively) low-temperature environment at step 306. This may include, for example, placing the structure 100' with the deposited thick film material 210 into the heater 214. The curing strengthens or hardens the deposited thick film material 210, ideally while most or all of the deposited thick film material 210 remains in the desired shape on the structure 100'. Example curing temperatures and curing times are provided above and generally do not exceed about 250° C. in temperature. As noted above, this is significantly lower that other processes involving high-temperature sintering operations or other high-temperature operations that can easily exceed 500° C., 700° C., or even 850° C. in temperature. The ability to cure the deposited thick film material 210 at lower temperatures enables the use of plastics or other materials that cannot withstand the elevated temperatures used in standard sintering operations or other high-temperature operations.

Any additional processing operations for forming a thick film resistor are performed at step 308. This may include, for example, etching the deposited thick film material 210 so that a final desired resistance value is obtained for the thick film resistor 102. This may also include cleaning the thick film resistor 102 or other components of the structure 100'. In addition, this may include applying power (such as about 0.25 W to about 0.5 W) across the thick film resistor 102 to help prevent subsequent changes to the resistance of the thick film resistor 102 (which occurs in a process that may be referred to as a "burn-in" process).

Fabrication of a desired structure is completed at step 310. This may include, for example, forming one or more protective layers of material or additional electrical components over the thick film resistor 102 and the conductive traces 104 and 106. This may also include electrically coupling the conductive traces 104 and 106 to other circuit components to incorporate the thick film resistor 102 into a larger circuit. Of course, the thick film resistor 102 can be used in any suitable manner, and the operations performed here can vary widely based on how the thick film resistor 102 is to be used.

Although FIG. 3 illustrates one example of a method 300 for forming a thick film resistor having a customizable resistance, various changes may be made to FIG. 3. For example, while shown as a series of steps, various steps in FIG. 3 may overlap, occur in parallel, occur in a different order, or occur any number of times. Also, various additional operations may occur at any points in the method 300 in order to obtain certain results from the overall process. For instance, one or more operations may occur at some point during the process to help reduce or prevent oxide formation on the conductive traces 104 and 106, such as by using the various techniques that are described above.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
blending at least one dielectric material with a carbon-based ink to form a modified carbon-based ink, the at least one dielectric material comprising a titanate;
printing the modified carbon-based ink onto a structure;
curing the printed modified carbon-based ink on the structure at a temperature that does not exceed about 250° C.; and
processing the cured printed modified carbon-based ink to form a thick film resistor;
wherein blending the titanate with the carbon-based ink causes the modified carbon-based ink to have a resistivity that is at least double a resistivity of the carbon-based ink.

2. The method of claim 1, wherein the at least one dielectric material consists essentially of the titanate.

3. The method of claim 1, wherein printing the modified carbon-based ink onto the structure comprises printing the modified carbon-based ink onto the structure such that the printed modified carbon-based ink connects multiple conductive traces.

4. The method of claim 1, wherein the printed modified carbon-based ink is cured at a temperature that does not exceed about 160° C.

5. The method of claim 1, wherein processing the cured printed modified carbon-based ink to form the thick film resistor comprises etching the cured printed modified carbon-based ink to obtain a desired resistance value.

6. The method of claim 1, wherein processing the cured printed modified carbon-based ink to form the thick film resistor comprises applying about 0.25 W to about 0.5 W of power to the thick film resistor.

7. The method of claim 1, wherein the thick film resistor is configured to at least one of:
handle up to about 200 mA of current without fusing; and
handle up to about 1.0 W of power without fusing.

8. A method comprising:
obtaining a modified carbon-based thick film material that comprises a carbon-based thick film material blended with at least one dielectric material, the at least one dielectric material comprising a titanate;
depositing the modified carbon-based thick film material onto a structure;
curing the deposited modified carbon-based thick film material on the structure at a temperature that does not exceed about 250° C.; and
processing the cured deposited modified carbon-based thick film material to form a thick film resistor;
wherein the titanate blended with the carbon-based thick film material causes the modified carbon-based thick film material to have a resistivity that is at least double a resistivity of the carbon-based thick film material.

9. The method of claim 8, wherein an amount of the titanate blended with the carbon-based thick film material does not exceed about 5% to about 15% by weight of the modified carbon-based thick film material.

10. The method of claim 8, wherein the at least one dielectric material comprises at least one of: barium titanate, strontium titanate, and barium strontium titanate.

11. The method of claim 8, wherein depositing the modified carbon-based thick film material onto the structure comprises depositing the modified carbon-based thick film material onto the structure such that the deposited modified carbon-based thick film material connects multiple conductive traces.

12. The method of claim 8, wherein the deposited modified carbon-based thick film material is cured on the structure at a temperature that does not exceed about 160° C.

13. The method of claim 8, wherein processing the cured deposited modified carbon-based thick film material to form the thick film resistor comprises etching the cured deposited modified carbon-based thick film material to obtain a desired resistance value.

14. The method of claim 8, wherein processing the cured deposited modified carbon-based thick film material to form the thick film resistor comprises applying about 0.25 W to about 0.5 W of power to the thick film resistor.

15. The method of claim 8, wherein the thick film resistor is configured to at least one of:
   handle up to about 200 mA of current without fusing; and
   handle up to about 1.0 W of power without fusing.

16. An apparatus comprising:
   a thick film resistor fabricated by:
      printing a modified carbon-based ink onto a structure, wherein the modified carbon-based ink comprises at least one dielectric material blended with a carbon-based ink, the at least one dielectric material comprising a titanate;
      curing the printed modified carbon-based ink on the structure at a temperature that does not exceed about 250° C.; and
      processing the cured printed modified carbon-based ink to form the thick film resistor;
   wherein the titanate blended with the carbon-based ink causes the modified carbon-based ink to have a resistivity that is at least double a resistivity of the carbon-based ink.

17. The apparatus of claim 16, wherein the at least one dielectric material consists essentially of the titanate.

18. The apparatus of claim 16, wherein the thick film resistor electrically connects multiple conductive traces of the structure.

19. The apparatus of claim 16, wherein the thick film resistor is configured to handle up to about 200 mA of current without fusing.

20. The apparatus of claim 16, wherein the thick film resistor is configured to handle up to about 1.0 W of power without fusing.

* * * * *